US006767251B2

(12) United States Patent
Yu et al.

(10) Patent No.: US 6,767,251 B2
(45) Date of Patent: Jul. 27, 2004

(54) ELECTRICAL CONNECTOR SUPPORTED ON PRINTED CIRCUIT BOARD

(75) Inventors: Weicheng Yu, Kunsan (CN); Weiya Cheng, Kunsan (CN); GuangXing Shi, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/143,616

(22) Filed: May 9, 2002

(65) Prior Publication Data

US 2003/0199197 A1 Oct. 23, 2003

(30) Foreign Application Priority Data

Apr. 18, 2002 (TW) ...................................... 91205234 U

(51) Int. Cl.$^{7}$ ...................... H01R 13/648; H01R 12/00; H05K 1/00

(52) U.S. Cl. ......................................... 439/607; 439/79

(58) Field of Search .................................... 439/607, 79

(56) References Cited

U.S. PATENT DOCUMENTS 5,125,853 A * 6/1992 Hashiguchi ................. 439/607
5,356,300 A * 10/1994 Costello et al. ............. 439/101
5,692,912 A * 12/1997 Nelson et al. ................ 439/79
5,697,799 A * 12/1997 Consoli et al. ............. 439/181
6,168,468 B1 * 1/2001 Zhu et al. ................... 439/607
6,224,420 B1 * 5/2001 Nishio et al. ............... 439/566
6,241,556 B1 * 6/2001 Chih .......................... 439/607

OTHER PUBLICATIONS

Jeff Hpodhca, Docking Connector Simplity Drive Designs, Connector Specitier, Mar. 2000, pp. 16–17.

* cited by examiner

*Primary Examiner*—Chandrika Prasad
(74) *Attorney, Agent, or Firm*—Wei Te Chung

(57) ABSTRACT

An electrical connector (1) has an insulative housing (10), a plurality of terminals (30) and a metal shield (40). The housing has a front wall (100), a mating portion (12) projecting forwardly from the front wall, two side walls (105) respectively defining a pair of gaps (22) therethrough, and a rear wall (102) defining a pair of notches (24) in communication with the gaps. The mating portion defines a plurality of passageways (16) for receiving the contacting sections (34) of the terminals. The shield has a lower wall (58) and two side walls (42). The lower wall of the shield has a pair of downwardly protruding portions (59). The side walls of the shield respectively form a pair of fastening portions (44) projecting through the gaps of the housing and bend inwardly into the notches.

14 Claims, 7 Drawing Sheets

ELECTRICAL CONNECTOR SUPPORTED ON PRINTED CIRCUIT BOARD

BACKGROUND OF THE INVENTION

1. Field of the Invention

The present invention generally relates to an electrical connector, and more particularly to an electrical connector ensuring a reliable connection between terminals thereof and a printed circuit board (PCB).

2. Brief Description of the Related Art

Portable electrical or electronic appliances normally use electrical connectors to transmit signals. The electrical connectors often have metal shields enclosing the housings thereof for preventing electromagnetic interference. U.S. Pat. Nos. 5,697,799, 5,692,912, 5,356,300 and 5,125,853 show such electrical connectors. These electrical connectors either have a large dimension or have a complicated manufacturing process. Connector Specifier published in March 2000 has an article named "Docking Connectors Simplify Drive Designs" on Pages 16 and 17, which introduces some related electrical connectors. Such information is submitted herewith by Information Disclosure Statement.

Referring to FIGS. 6 and 7, U.S. Pat. No. 6,241,556, assigned to the same assignee as the present invention, discloses a related electrical connector 7. The electrical connector 7 has a metal shield 71, an insulative housing 72 and a plurality of terminals 73 fixed in the housing 72. The metal shield 71 has a top wall 710, two side walls 712 with a pair of fastening portions 718 extending respectively therefrom and a bottom wall 715. A pair of latches 714 extends from the top wall 710 with a pair of grooves 716 defined respectively therein. A pair of plates 711 extends from the side walls 712 respectively with a pair of mating holes 713 defined respectively therein. The housing 72 has an upper wall 720, two side walls 725 with a pair of channels 728 defined respectively therein and a lower wall 723 with a pair of posts 721 extending therefrom. A pair of depressions 722 is defined in the upper wall 720 for receiving the latches 714 of the shield 71. A pair of blocks 724 is formed by the housing 72 respectively in the depressions 722 for engaging with the grooves 716. The fastening portions 718 respectively extend through the channels 728 and are bent outwardly to engage with protrusions 719 formed on a rear face of the housing 72. When the electrical connector 7 is assembled to a printed circuit board (PCB) 8, the pair of posts 721 engages into corresponding holes (not shown) of the PCB 8, so that a bottom surface of the lower wall 723 of the housing 72 is mounted to the PCB 8.

However, a bottom surface of the bottom wall 715 of the shield 71 is not coplanar with the bottom surface of the lower wall 723 of the housing 72, so that a gap is formed between the bottom surface of the bottom wall 715 and the PCB 8, whereby a front end of the electrical connector 7 is not supported on the PCB 8 when the electrical connector 7 is assembled thereto. Accordingly, the electrical connector 7 tends to incline forwardly, causing tail portion of the terminals 73 which are to be surface mounted to the printed circuit board 8 to not entirely abut against corresponding solder pads (not shown) on the printed circuit board. A gap is formed between the tail portions 732 and the corresponding solder pads, resulting in an inferior soldering or even a possible void soldering of the tail portions 732. Thus, a reliable connection between the terminals 73 and the PCB 8 can not be established. In addition, since the electrical connector 7 is not stably supported on the PCB 8, a mating of the connector with a complementary connector (not shown) may adversely affect the soldering joint between the terminals 73 and the PCB 8. Furthermore, the fastening portions 718 of the shield 71 which are bent away from the housing 72 occupy more space.

Hence, an improved electrical connector with an improved connection between the terminals and the PCB and occupying less space is needed to solve the above problems.

BRIEF SUMMARY OF THE INVENTION

It is an object of this invention to provide an electrical connector reliably supported on a printed circuit board (PCB) to ensure a reliable connection between terminals thereof and the PCB.

It is a further object of this invention to provide an electrical connector occupying less space.

The electrical connector in accordance with the present invention includes an insulative housing, a plurality of terminals and a metal shield. The housing has a body portion having a front wall, a rear wall, a top wall and two side walls, and a mating portion projecting forwardly from the front wall. The two side walls respectively have a pair of gaps defined therethrough. The rear wall defines a pair of notches in communication with the gaps. The mating portion defines a plurality of passageways for receiving contacting sections of the terminals. The top wall of the housing has a pair of depressions and a pair of blocks formed on bottoms of the respective depressions. The shield has an upper wall, a lower wall and two side walls. The lower wall of the shield has a pair of downwardly protruding portions formed thereon. The top wall has a pair of latches each defining a slot for engaging with corresponding block of the housing. The side walls of the shield respectively form a pair of bending portions projecting through corresponding gaps of the housing and bending inwardly into corresponding notches. A plate extends outwardly from each bending portion with a mounting hole defined therein.

Other objects, advantages and novel features of the invention will become more apparent from the following detailed description of a preferred embodiment when taken in conjunction with the accompanying drawings.

DETAILED DESCRIPTION OF THE INVENTION

Figure 1:
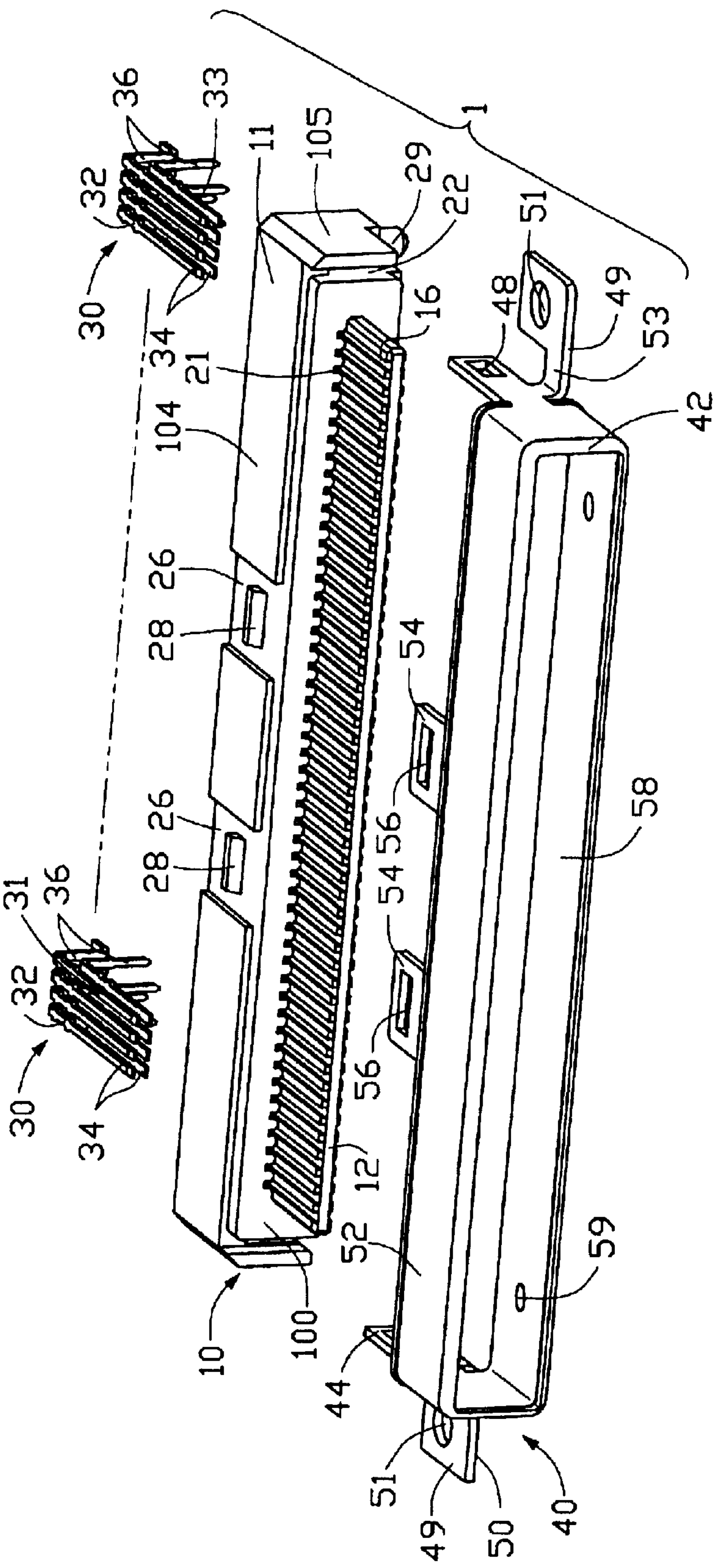
FIG. 1 is an exploded view of an electrical connector of the present invention.
Figure 2:
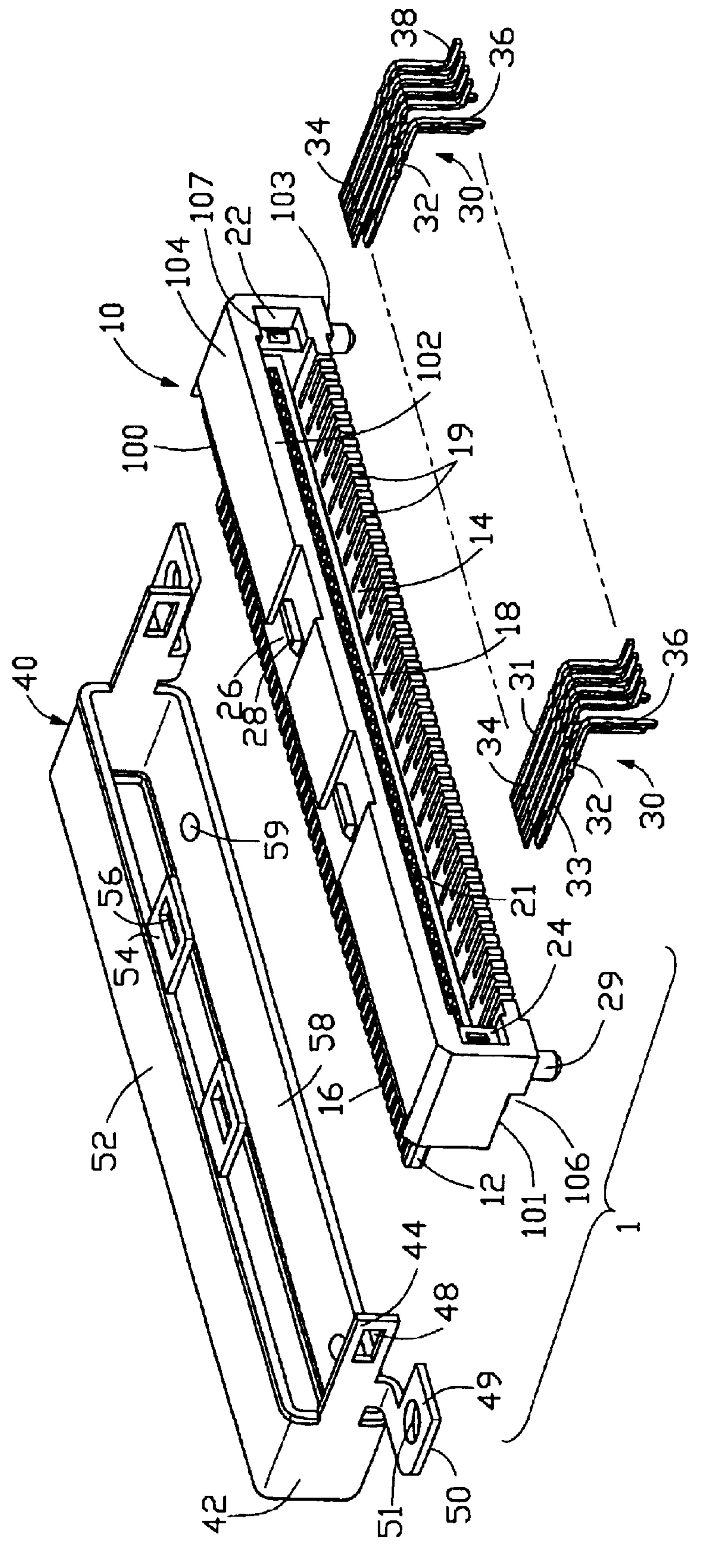
FIG. 2 is a view similar to FIG. 1, but viewed from a rear aspect.

Referring to FIGS. 1 and 2, an electrical connector 1 in accordance with the present invention has an insulative housing 10, a plurality of terminals 30 received in the housing 10 and a metal shield 40 formed into a generally quadrangular tubular configuration.

The housing 10 has a body portion 11 defining a recess 106 and a forwardly extending mating portion 12. The body portion 11 has a front wall 100, a mounting wall 101, a bottom wall 103, a rear wall 102, a top wall 104 and two side walls 105. The top wall 104 respectively defines a pair of spaced depressions 26 between the two side walls 105. A pair of blocks 28 is formed by the housing 10 and located respectively in the depressions 26. The rear wall 102 defines a groove 14 with an insert 18 formed therein and a pair of notches 24 respectively adjacent to the side walls 105. A pair of protrusions 107 projects rearwardly into the respective notches 24. The front wall 100 of the housing 10 defines an upper row and a lower row of cavities 21 (only the upper row visible) on opposite sides of the mating portion 12. The upper row of cavities 21 extends rearwardly through the insert 18. The side walls 105 respectively define a pair of gaps 22 communicating with corresponding notches 24. The bottom wall 103 has a pair of downwardly extending posts 29 respectively adjacent to the side walls 105 and defines a plurality of alternated long and short channels 19 which are spaced from each other. A bottom face of the mounting wall 101 is at a level higher than that of the bottom wall 103.

The mating portion 12, projecting forwardly from the front wall 100 of the housing 10, defines a plurality of passageways 16 communicating with corresponding cavities 21. The passageways 16 are arranged in both top and bottom sides of the mating portion 12.

Figure 5:
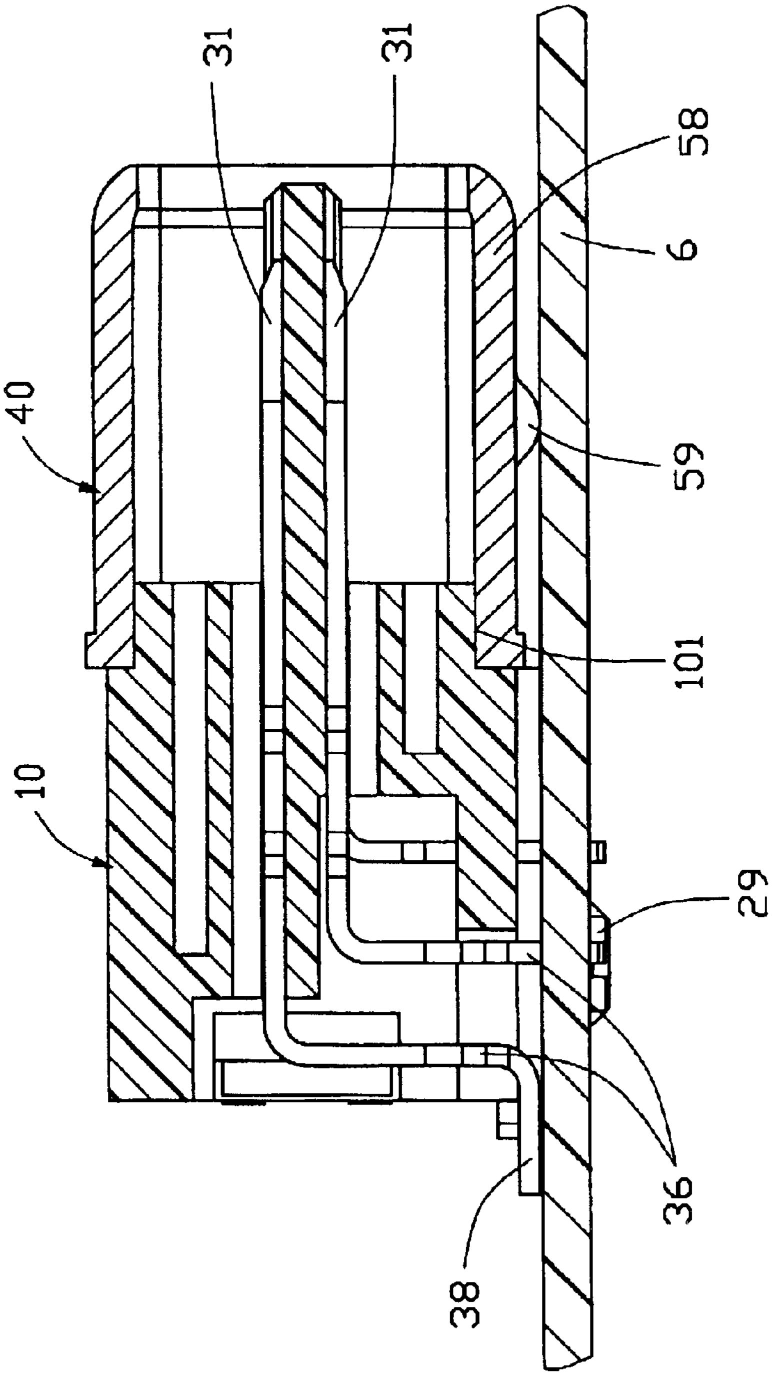
FIG. 5 is a cross-sectional view taken along line 5—5 of FIG. 4 together with a printed circuit board (PCB).
Figure 6:
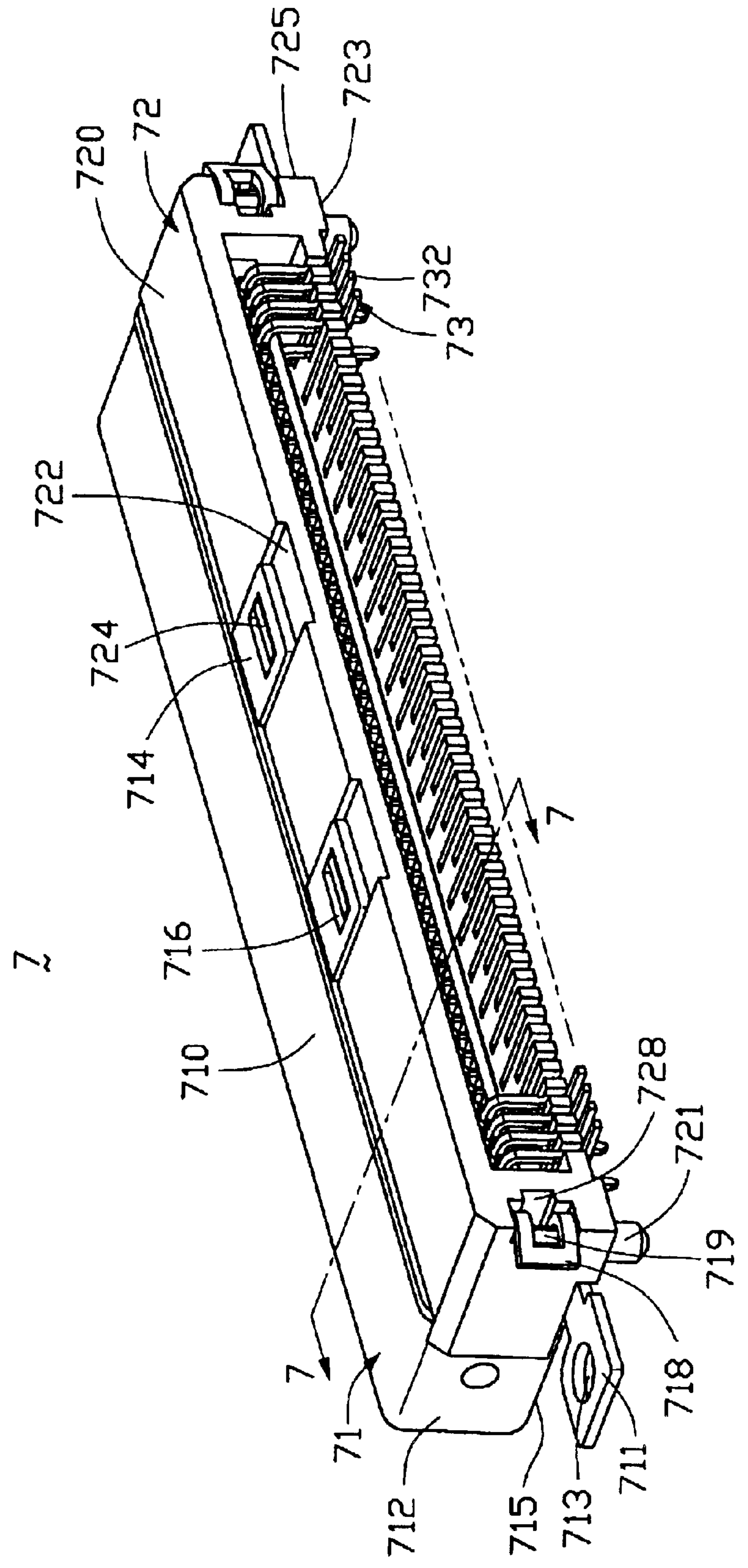
FIG. 6 (PRIOR ART)
FIG. 6 is an assembled view of an electrical connector if U.S. Pat. No. 6,241,556 B1.
Figure 7:
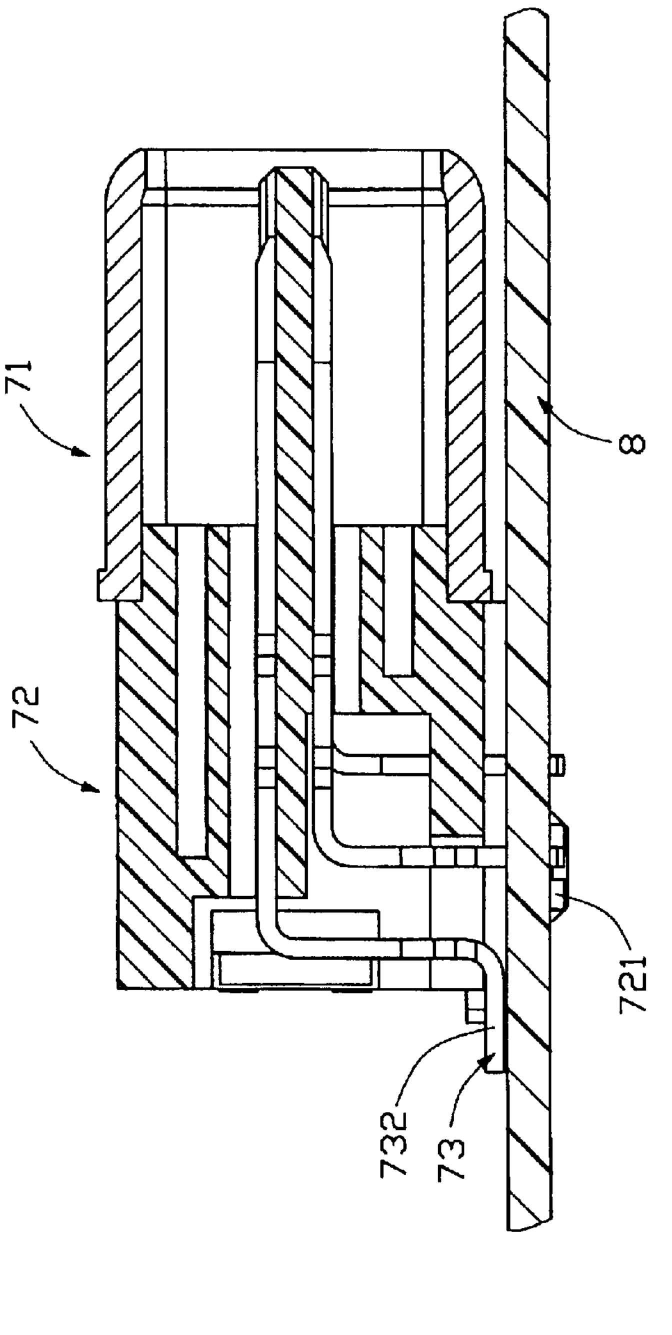
FIG. 7 (PRIOR ART)
FIG. 7 is a cross-sectional view taken along line 7—7 of FIG. 6 together with a PCB.

The terminals 30 consist of upper terminals 31 and lower terminals 33. Each of the upper and lower terminals 31, 33 has a contacting section 34, a mounting section 36 and a retention section 32. Each upper terminal 31 further has a soldering section 38 extending perpendicular to the mounting section 36. Both the retention sections 32 and the mounting sections 36 of the terminals 30 form barbs (not labeled) on opposed edges thereof. The soldering sections 38 are for surface mounting to a printed circuit board 6 (FIG. 5). The lower terminals 33 have soldering sections (not labeled) below the mounting section 36 thereof which are soldered to the printed circuit board 6 in a through hole manner.

The shield 40 has an upper wall 52, a lower wall 58 and two side walls 42. The upper wall 52 has a pair of latches 54 extending from a rear edge thereof. Each of the latches 54 has a slot 56 defined therein for engaging with a corresponding block 28 of the housing 10. The side walls 42 respectively have a pair of fastening portions 44 extending from rear edges thereof. A pair of cutouts 48 is defined respectively in free ends of the fastening portions 44 for engaging with corresponding protrusions 107 of the housing 10. A plate 49 extends laterally outwards from a bottom of each fastening portion 44. The plates 49 extend parallel to the latches 54 of the upper wall 52 and each has a neck 53 extending from the bottom of the fastening portion 44 for being received in a corresponding recess 106 of the housing 10 and a mounting hole 51 in a middle thereof. A pair of downwardly protruding portions 59 is formed on the lower wall 58 adjacent to corresponding side walls 42.

Figure 3:
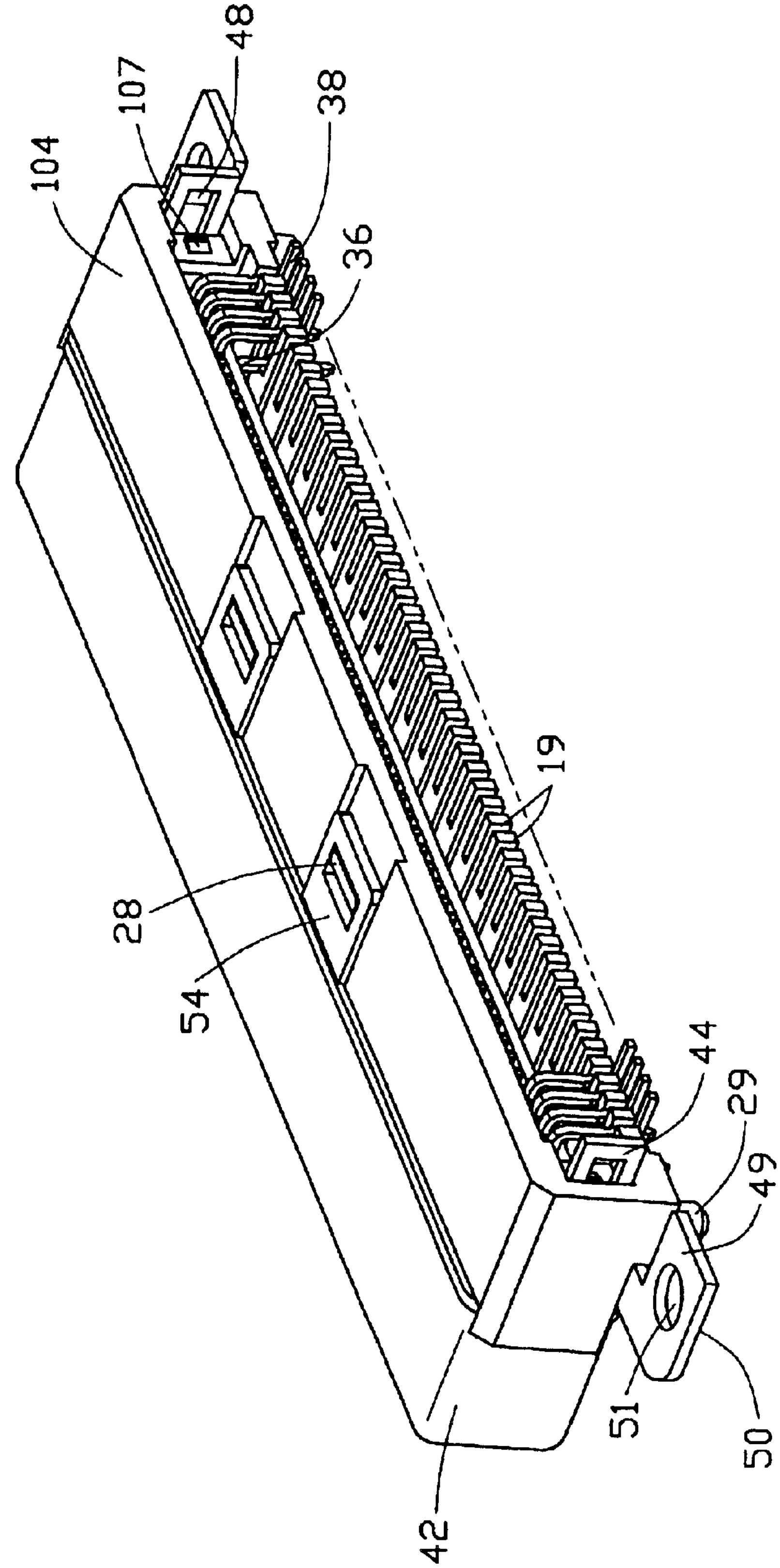
FIG. 3 is an assembled view of FIG. 2, with fastening portions of a shield not being bent.
Figure 4:
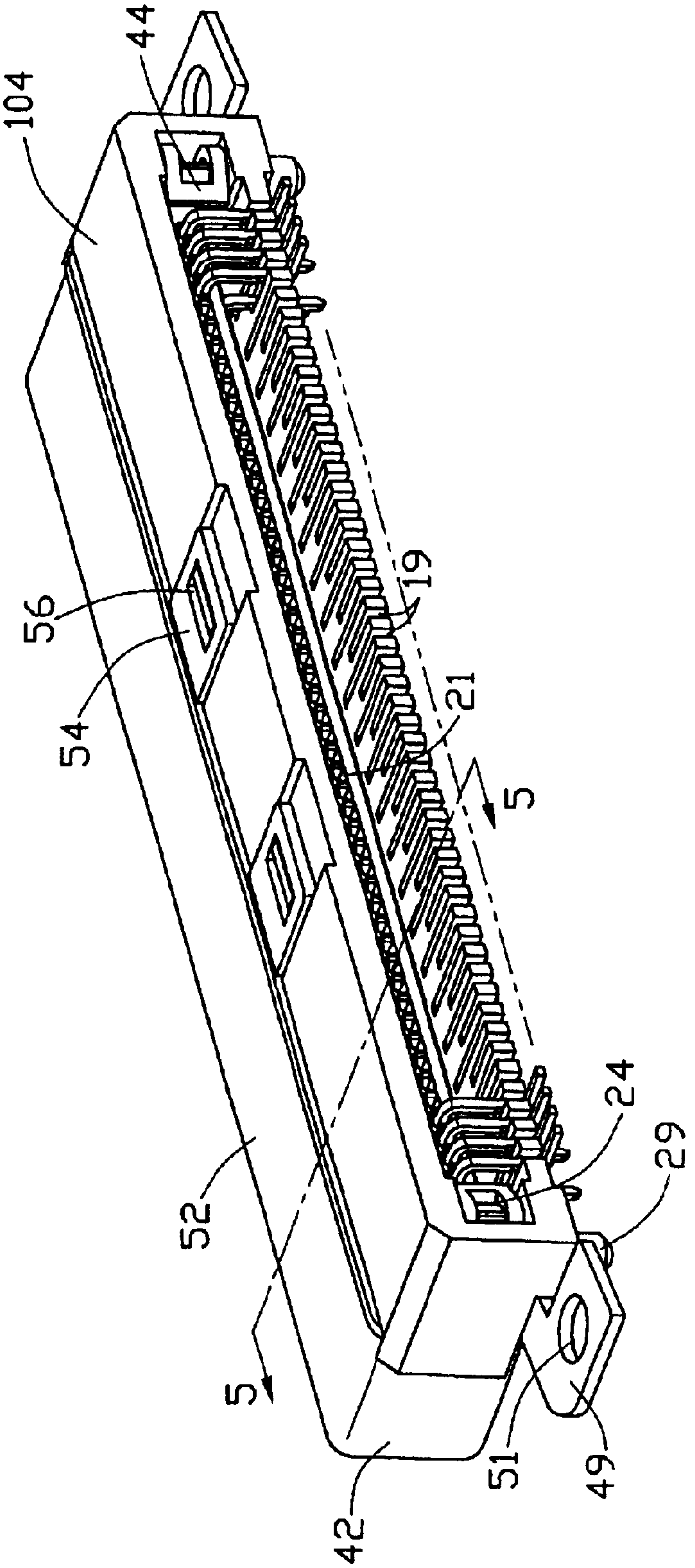
FIG. 4 is a view similar to FIG. 3, with the fastening portions of the shield being inwardly bent.

Referring to FIGS. 3, 4 and 5, in assembly, the posts 29 are fitted into corresponding holes (not shown) of the printed circuit board (PCB) 6 to preliminarily position the housing 10. The contacting sections 34 of the terminals 30 are respectively received in corresponding passageways 16. The mounting sections 36 of the terminals 30 are received in the channels 19 of the bottom wall 103 of the housing 10, and the retention sections 32 of the terminals 30 are received in the cavities 21. The soldering sections 38 of the upper terminals 31 are soldered to solder pads on the PCB 6 by surface mounting, and the soldering sections of the lower terminals 33 are received in corresponding holes (not shown) of the PCB 6, and soldered thereto by.

The fastening portions 44 of the shield 40 are inserted into corresponding gaps 22 of the housing 10. The mating portion 12 of the housing 10 is enclosed by the shield 40. The lower wall 58 has a rear portion abutting against the mounting wall 101 of the body portion 11. The latches 54 of the shield 40 are received in corresponding depressions 26 of the body portion 11 with the blocks 28 engaging with the slots 56 of the latches 54. The necks 53 of the plates 49 are received in corresponding recesses 106 of the housing 10. After the shield 40 is assembled to the housing 10, the free ends of the fastening portions 44 project rearwarly out of the corresponding gaps 22 of the housing 10 and are bent inward to be received in the notches 24. The cutouts 48 of the fastening portions 44 fittingly receive the protrusions 107 of the housing 10. The lower wall 58 of the shield 40 is supported on the PCB 6 by the protruding portions 59, so that a front end of the housing 10 and the contacting sections 34 of the terminals 30 are kept parallel to the PCB 6. The mounting holes 51 of the plates 49 are adopted to fix the electrical connector 1 to the PCB 6 with locking elements (not shown), for example, nuts and bolts.

An advantage of the present invention over the prior art is that the lower wall 58 of the shield 40 has the pair of protruding portions 59; thus, the front end of the electrical connector 1 is supported parallel to the PCB 6 when the electrical connector 1 is assembled to the PCB 6. As a result, during the surface mounting process, the soldering sections 38 of the upper terminals 31 are in intimate contact with the solder pads, whereby an optimal soldering of the soldering sections 38 can be obtained. Accordingly, a reliable connection between the soldering sections 38 of the terminals 30 and the PCB 6 is established. Another advantage of the present invention is that the fastening portions 44 of the shield 40 are inwardly bent, thereby occupying less space.

It is to be understood, however, that even though numerous, characteristics and advantages of the present invention have been set forth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector mounted on a printed circuit board (PCB), comprising:

an insulative housing having a body portion and a mating portion projecting from the body portion and defining a plurality of passageways, the body portion having a mounting wall, a bottom wall for being mounted to the PCB, two side walls and a plurality of cavities in communication with corresponding passageways, the side walls respectively defining a pair of gaps, the mounting wall being at a level higher than the bottom wall;

a plurality of terminals received in the passageways and the cavities of the housing, at least some of the terminals are surface mounted to the PCB; and a metal shield assembled to the housing and having a lower wall distanced from the PCB and abutting against the mounting wall of the body portion of the housing, the lower wall comprising protruding portion supporting the lower wall of the shield and a front portion of the electrical connector on the PCB; wherein said protruding portion is just integrally bumped from said lower wall without forming any opening thereabouts in said lower wall.

2. The electrical connector of claim 1, wherein the body portion has a pair of notches in communication with the gaps.

3. The electrical connector of claim 2, wherein the shield has side walls each having a fastening portion projecting rearwardly out of a corresponding gap of the housing, said fastening portions being bent inwardly to be received in the notches.

4. The electrical connector of claim 1, wherein the bottom wall of the housing defines a plurality of channels receiving mounting sections of the terminals.

5. The electrical connector of claim 1, wherein the bottom wall of the housing has a pair of posts extending downwardly therefrom adjacent to corresponding side walls thereof and into holes of the PCB.

6. The electrical connector of claim 1, wherein the passageways are defined in both top and bottom sides of the mating portion.

7. The electrical connector of claim 3, wherein the shield has a pair of plates extending outwardly from the fastening portions, respectively.

8. The electrical connector of claim 7, wherein each of the plates of the shield has a neck extending from a corresponding fastening portion and a mounting hole for fixing the connector to the PCB.

9. The electrical connector of claim 1, wherein the housing has a top wall defining a pair of depressions, and wherein the shield has an upper wall having a pair of latches extending rearwardly and received in the depressions of the housing.

10. The electrical connector of claim 9, wherein the housing has a pair of blocks formed on bottoms of the respective depressions, respectively, and each latch of the shield defines a slot engaging with a corresponding block of the housing.

11. An electrical connector assembly comprising:

a printed circuit board;

an insulative housing horizontally mounted on the printed circuit board, said housing defining a body portion with on an underside thereof a mounting surface seated upon said printed circuit board;

a plurality of terminals disposed in the housing; and a circumferential metallic shell attached to the body portion and defining a horizontal mating port in front of the body; wherein a lower wall of said shell is essentially closely spatially above said printed circuit board in parallel relation while further includes at least one protrusion downwardly extending therefrom and seated upon the printed circuit board; wherein said at least one protrusion is just integrally bumped from said lower wall without forming any opening thereabouts in said lower wall.

12. The assembly of claim 11, wherein said housing further includes a mating portion extending forwardly from the body portion and enclosed within the mating port.

13. The assembly of claim 12, wherein front sections of the terminals are located on the mating portion.

14. An electrical connector comprising:

a horizontal isolative housing defining a front mating portion and a rear body portion;

a mounting surface formed on an undersurface of said body;

a plurality of terminals disposed in the housing, each of said terminals defining a mating section around the mating portion and a mounting section around the body; and a circumferential metallic shell attached to the body portion and enclosing the mating portion; wherein a lower wall of the shell is located above said mounting surface while with a protrusion extending therefrom downwardly to be flush with said mounting surface; wherein said protrusion is just integrally bumped from said lower wall without forming any opening thereabouts in said lower wall.

* * * * *